United States Patent [19]

Groves et al.

[11] Patent Number: 4,523,975

[45] Date of Patent: Jun. 18, 1985

[54] INTEGRATED CIRCUIT PLANARIZING PROCESS

[75] Inventors: Christopher K. Groves, Bromont, Canada; Kevin Duncan, St. Albans, Vt.; Edward C. D. Darwall, Bromont, Canada

[73] Assignee: Mitel Corporation, Ontario, Canada

[21] Appl. No.: 372,690

[22] Filed: Apr. 28, 1982

[30] Foreign Application Priority Data

Apr. 19, 1982 [CA] Canada ................................. 401226

[51] Int. Cl.³ .......................................... H01L 21/312
[52] U.S. Cl. ................... 156/643; 156/657; 156/661.1; 156/668
[58] Field of Search ............... 156/643, 661.1, 657, 156/668; 427/96

[56] References Cited

U.S. PATENT DOCUMENTS

| | | | |
|---|---|---|---|
| 4,025,411 | 5/1977 | Hom-Ma et al. | 156/643 X |
| 4,070,501 | 1/1978 | Corbin et al. | 156/643 X |
| 4,321,284 | 3/1982 | Yakushiji | 427/96 |

Primary Examiner—Evan K. Lawrence
Attorney, Agent, or Firm—Antonelli, Terry & Wands

[57] ABSTRACT

A planarizing process for producing a passivation or insulating layer immediately underlying an upper metallized layer on the surface of an integrated circuit having very large radius of curvature steps, thus providing a reliable base for the metallized layer. The process is comprised of the steps of depositing and defining first metal conductors on the surface of an integrated circuit, depositing a first dielectric layer over the surface of the integrated circuit including the conductors, the dielectric layer being comprised of material selected from the group comprised of silicon dioxide and silicon nitride, depositing and polymerizing a layer of negative isoprene resist over the surface of the dielectric layer, plasma etching the surface of the isoprene and dielectric layers to a predetermined thickness over the metal conductors in an atmosphere of $CF_4$ gas containing 32 to 50% oxygen, cleaning the etched surface, and depositing a second dielectric layer over the surface selected from a group comprised of silicon dioxide and silicon nitride, whereby a surface having very large radius of curvature steps over the metal conductors is produced.

34 Claims, 11 Drawing Figures

INTEGRATED CIRCUIT PLANARIZING PROCESS

This invention relates to a method of making an integrated circuit and particularly to a planarizing process for the surface thereof whereby an upper metallized layer can be deposited crossing over a lower conductive layer in an improved manner.

Typically one of the last steps in the manufacture of integrated circuit chips is the deposition (e.g. by evaporation) of a metallized layer. The metallized layer is then defined by etching through a photoresist mask to form conductors interconnecting various portions of the underlying diffused regions. The final step usually is passivation of the surface of the integrated circuit, which provides protection for the surface, including the conductors.

Some integrated circuits require an additional layer of conductors which cross over the conductors of the first metallized layer. Problems have been encountered with the reliability of the upper metallized layer; the passivation layer overlying the first metallized layer has been found to contain sharp notches and angles, generally alongside the underlying conductors, and the resulting sharp angled surface contour has resulted in cracks in the overlying conductor, in incomplete or too thin conductors, etc. at the sharp angled passivation layer notches and angles. This results in open circuits, regions of lower current carrying capacity, increased resistance or electromigration under high current conditions or other forms of physical stress in the overlying conductor.

The present invention is directed to a process for smoothing the sharp angles in the passivation or insulating layer immediately underlying the upper conductive layer, so that the upper conductive layer is deposited only on a surface which is smooth, and all angles are of large radius with no overhangs.

We are aware of three processes which are generally used to provide an under insulating layer and upper metallized layer which crosses over an underlying metallized layer. In one process, a polyimide layer is deposited over the underlying metallized layer or over an oxide layer covering the underlying metallized layer and other regions of the integrated circuit. The polyimide layer, while first conforming to the underlying layer with its sharp angles, is then heated, and through a reflow process, the sharp edges, corners and cracks are softened and filled, substantially increasing their radii or curvature. An upper crossover metallized layer is then deposited over the polyimide layer.

However, the polyimide layer, being an organic compound has been difficult to characterize accurately, and difficult to stabilize over the long term. In addition, polyimide has some inherent flexibility, which can effect the reliability of the overlying metallized layer.

A second process is to evaporate the underlying metallized layer through an opening in a masking layer. After evaporation the masking layer is dissolved, removing unwanted metallization and leaving the underlying metallized conductor having bevelled edges. Following deposition of an overlying oxide layer, it is presumed that the corner angles of the oxide layer are less sharp than with underlying conductors having generally vertical walls.

However it has been found that deposition of the overlying oxide results in channels being formed following alongside the edges of the underlying conductors, the channels interfering with the integrity of the oxide layer and potentially causing problems during subsequent etches.

A third process is to simply cover the underlying conductors with an oxide layer, and then form an upper metallized layer over the oxide, hoping that sufficient yield of good devices will result. The reliability of the process can be enhanced by increasing the thickness and line width of the upper conductors. However this increases the cost of the integrated circuits, since yield and density decreases.

A process has been proposed by A. C. Adams and C. D. Capio in the Journal of the Electrochemical Society: Solid State Science and Technology, Vol. 128, No. 2, February 1981, pages 423–429, entitled "Planarization of Phosphorus-Doped Silicon Dioxide" which was believed to hold some promise. In this process, an underlying polysilicon conductive layer is covered by phosphorus-doped silicon dioxide. The expected sharp angled steps over the underlying polysilicon are observed. The entire surface is then covered with a positive photoresist layer which has a low viscosity and flows into all the sharp angled corners, resulting in a relatively smooth surface having very large radius corners. The photoresist and underlying phosphorus-doped silicon dioxide are then etched at what is indicated to be nearly the same rates. This causes the silicon-dioxide step over the underlying polysilicon as well as the peripheral regions to be etched, leaving approximately the profile of the original upper surface of the photo-resist layer. The step heights are reduced by at least 50%. An upper metallized conductive layer can then be deposited. This process is called planarization.

However, it has been found that several defects are associated with the planarization process noted above. The photoresist has been found to break down during etching, causing uneven etching and cracks in the underlying oxide. Etching has been found to be nonuniform, and slow. Further, the remaining thickness of oxide over the underlying conductors following etching is not precisely known and therefore is not precisely controllable.

The present invention is a planarization process which has been found to result in uniform and fast etching, a smooth upper surface having few, if any defects caused by the process, and a controlled and predictable thickness of insulating layer overlying the lower conductors. a highly reliable upper conductive layer results. The entire process is controlled and predictable.

According to the present invention, etching is continued to a different thickness of the oxide layer and photoresist than in the prior art. Also, rather than using 8% oxygen with $CF_4$ gas in a plasma etching process for the photoresist and oxide, a considerably higher 32–50% oxygen concentration is used. Further, the prior art photoresist layer used is positive type. According to the present invention negative type photoresist should be used.

In the prior art process the photo-resist and underlying oxide is etched to reduce the step height. However in the process according to the present invention the step height is generally maintained, but the entire photo-resist-oxide surfaces are etched down completely to or virtually to the upper surface of the underlying conductors. A further oxide layer is then deposited to a known thickness, followed by photo engraving of via holes and deposition of the upper conductive layer. A precisely controlled insulating oxide layer thickness is thus achieved between the conductor layers, since the position of the upper surface of the underlying conductors is known and becomes a base point for the next overlying oxide layer.

In the prior art process, phosphorus-doped silicon dioxide was used, the phosphorus being required for gettering and to facilitate reflow. However, high phosphporus concentration generates phosphoric acid which can attack aluminum conductors. Presumably for this reason the underlying conductors are described in the aforenoted publication as being formed of polysilicon, rather than aluminum. In the present invention, however, gettering is done is an oxide layer below the lower conductive layer. Therefore aluminum, aluminum-silicon alloy, or any other suitable conductor which does not become appreciably etched in $CF_4+O_2$ (32%–50%) can be used as either or both conductive layers, since the overlying oxide can be undoped silicon dioxide, or silicon dioxide having very little doping, resulting in the generation of virtually no phosphoric acid. Further, either or both of the oxide layers (prior to and after etching) can be silicon nitride rather than silicon dioxide. However, being of different composition, it etches at a different rate than silicon dioxide, which must be taken into account.

A better understanding of the invention will be obtained with reference to the detailed description below in conjunction with the following drawings, in which:

FIGS. 1, 2, 3A, 4A, 5, and 6 are cross-sections of the upper layers of an integrated circuit at various stages in the process of the invention, FIG. 2B is an enlarged view of a portion of FIG. 2A, FIGS. 3B and 3C are cross-sections showing profiles of positive and negative type photoresist layers.

Figure 1:
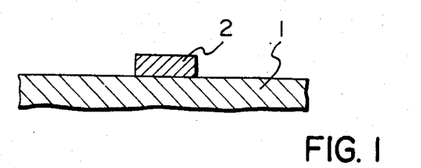

FIG. 1 is a cross-section of the upper layers of an integrated circuit 1, on which a metallized conductor 2 for interconnecting various regions of the integrated circuit has been deposited and defined in a well known manner. The conductor can be any material which is resistant to etching to be undertaken in a later step, e.g. using $CF_4$ gas with about 32–50% oxygen. In this respect the invention differs fundamentally from the process described in the aforenoted Journal of Electrochemical Society article; the underlying conductive layer in that article, being formed of polysilicon, can be etched at a comparable rate to the silicon dioxide layer to be deposited over and around it. In the present case, as will be noted later, the etching step continues until the upper surface of the underlying conductive layer is exposed, and thus the underlying conductor should be etch resistant to the etchant or to the etching process which is used.

It will be understood that the integrated circuit 1 to be dealt with herein typically is completed except for the final metallized and passivation layer. The metallized layer stands exposed. The layer directly underlying the metallized conductor 2 would be typically silicon dioxide, usually phosphorus doped in order to provide gettering, according to a well known practice.

The conductor 2 typically will be formed of aluminum, having a thickness of between about 0.7 and 1.3 microns.

Figures 2A, 3A:
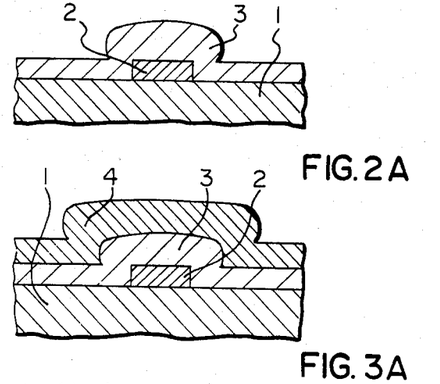

As shown in FIG. 2A, a doped or undoped silicon dioxide layer 3 is then deposited over the surface of the integrated circuit and metallized conductor 2. The silicon dioxide layer can be deposited by vapor deposition, using either CVD or low pressure CVD process. The thickness of layer 3 should be approximately the same as that of the lower conductor layer, e.g. approximately 0.8–1.4 microns typically.

It is preferred to use a low pressure CVD system to deposit the silicon dioxide layer, in which the silicon dioxide is deposited at about 350° C. at a pressure of a few hundred millitor. Preferably the silicon dioxide is either undoped or doped to a very low extent, e.g. less than 4%. However, the amount of doping can be different for reasons which will be described later.

As shown in FIG. 3A, a layer of negative type photoresist 4 is now spun on the surface, to a thickness to about 0.9 microns. A photoresist which was successfully used is type HR200, available from Hunt Chemical Corporation. The photo-resist was spun on at 5,000 rpm. The photoresist was baked at 160° C. for 20 minutes, polymerizing it.

Any type of basic carrier negative isoprene resist can be used for the photoresist, e.g. any cis polyisoprene which has comparable viscosity when applied can be used.

Figure 3B:
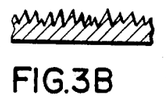

It has been found that the uneven etching and cracks in the prior art method resulted from the use of positive photoresist. An analysis of the surface profile of positive type photoresist in a scanning electron microscope established that the cross-section of positive type photoresist appears as shown in FIG. 3B.

Figure 3C:
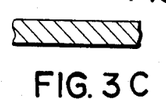

The profile of a negative type photoresist layer after etching is shown in FIG. 3C. Clearly the upper surface is very smooth relative to the upper surface of positive type photo-resist shown in FIG. 3B.

The use of negative type photoresist is an important element in the present invention.

It is preferred that the thickness of the photo-resist should not usually be less than 0.5 microns, since below that thickness pin holes begin appearing. If a negative type photoresist which is pin hole immune is formulated, the thickness can be below 0.5 microns, but thickness should be at least as thick as the oxide step which is to be smoothed.

The upper surface of the integrated circuit is now subjected to a plasma etching step. The gas used during the plasma etch should be $CF_4+O_2$, the amount of oxygen being 32–50%. Using a Tegal 700 planar plasma etcher at a pressure of 1.1 torr and temperature of 70° C., it was found that a total 5 minute etch was sufficient, the etchant rate being about 2,300 angstroms per minute, both for photoresist and oxide. However this time can vary depending on the etching apparatus used.

However, it has been found that the pressure used can be between 0.9 and 1.6 torr to achieve highest etch rates; best uniformity was found between 1.0 and 1.4 torr.

It should also be noted that the apparatus used to achieve the result described should be a plasma etcher such as the Tegal 700, as opposed to a reactive ion etcher, which operates at much lower pressures.

Figures 4A, 5:
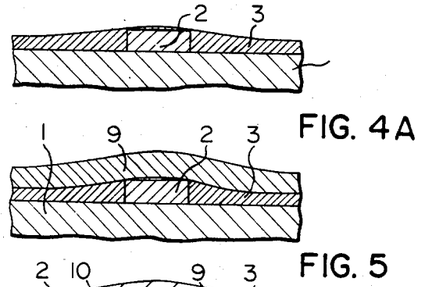

The resulting profile of the upper layer portion of the integrated circuit is as shown in FIG. 4A. The photoresist layer has been completely etched away as well as a significant thickness of the silicon dioxide layer 3. It was noted earlier that it is preferred that the silicon dioxide layer should be eteched until the upper surface of conductor 2 is exposed. However it should be understood that the etching step should continue until the oxide is etched at least to the vicinity of the upper surface of the lower conductor, within the tolerance of the deposition thickness of the insulating layer applied over the conductor layer 2. Thus there may well be a small layer of silicon dioxide left over all or part of the upper surface of conductor 2. The conductor 2, however is left untouched.

The surface is then cleaned using conventional techniques.

Figure 2B:
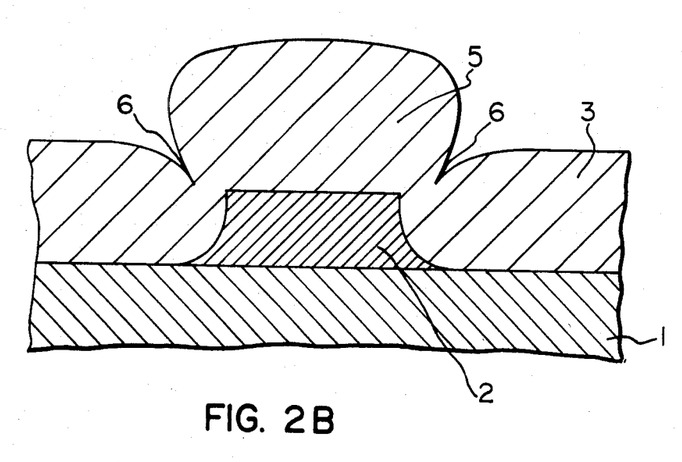

Turning now to FIG. 2B, an enlarged crossection of FIG. 2 is shown to illustrate some of the problems associated with conductor crossovers. The upper surface of the integrated circuit 1, e.g. an insulating layer is shown as the botttom layer in FIG. 2B. A conductor layer 2 underlies the upper insulating and passivating layer 3, of the integrated circuit, and a thin insulating layer 3 typically formed of silicon dioxide overlies the entire surface. It may be seen that a step 5 is formed over the conductor 2. The width of the step is wider than the top surface of conductor 2, and the bottom profile of the step takes the form of an elongated cusp 6 on each side of and along the conductor. It will be realized that depositing a metallized layer over the step often results in no or extremely thin deposition in the cusps, due to shadowing. Further, the very sharp angles within the cusps can cause cracking of the overlying metallized layer even if it is deposited over the entire cusps, caused by temperature induced strain and other stresses.

Figure 4B:
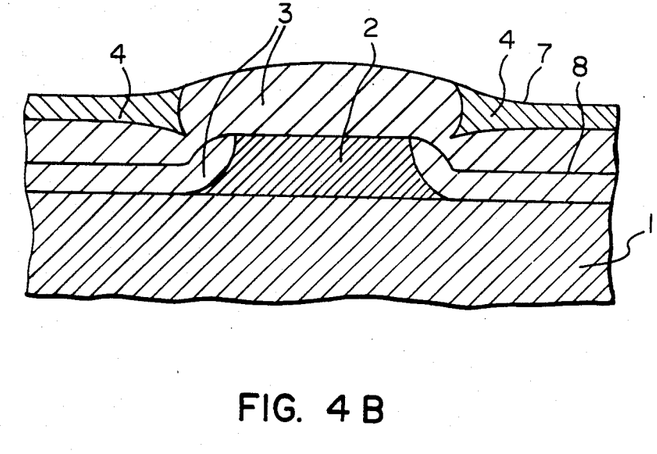
FIG. 4B is an enlarged view of the etched upper surface at successive stages.

FIG. 4B shows the effect of etching during the planarization step. Two upper profiles, 7 and 8, are shown illustrating stages in the process described so far, i.e., between FIG. 3A and FIG. 4A. Ignoring profile 8 for the moment, the photoresist 4 has been eroded during etching to the point at which the silicon dioxide layer 3 is exposed under the step, yielding profile 7. It may be seen that both the photo-resist and top of the step have been eroded, but the regions locally surrounding the step remain covered with photoresist 4.

As the plasma etching continues, eventually the upper surface profile 8 forms, the photoresist 4 having been eroded away and the silicon dioxide layer 3 having been etched to about the top surface of the conductor 2, forming a relatively smooth surface around the corners of the step.

It should be noted that the etching step to the top surface of the conductor would not be possible in the procedure described in the aforenoted Journal of Electrochemical Society article since the polysilicon conductor used etches at rate comparable to the overlying silicon dioxide layer.

A second layer of oxide is now deposited using well known methods, as shown in FIG. 5. This oxide layer performs a number of functions: to obtain oxide integrity, to fill out any notches which may remain, and to control the amount of insulating oxide overlying the lower conductors 2, i.e., to define the thickness of the insulator between the crossover conductors and the underlying conductors. The second oxide layer 9 can be doped or undoped, depending on the design of the integrated circuit, and can be deposited using either a lower pressure CVD or a CVD process. Typically the second oxide layer should be about 0.4–1 micron in thickness, although other thicknesses can be used as desired. Alternatively, a plasma enhanced deposition of silicon dioxide could be used.

The resulting surface was viewed in a scanning electron microscope, and the step slopes were so gradual, virtually no step whatsoever was discernible. However other measurements established that a step was indeed present. Clearly, the slopes of the step were made so gradual that the reliability of an overlying metallization layer would be virtually undegraded due to the presence of the step.

Figure 6:
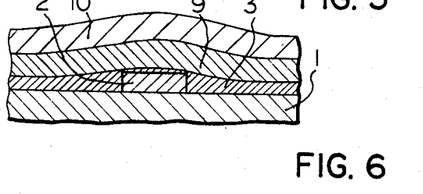

FIG. 6 shows a profile of the upper surface of the integrated circuit following an upper conductor metallization step. An upper conductor layer 10 is deposited and defined according to a well known technique such as sputtering of aluminum. The upper conductor layer is insulated from conductor 2 by a completely controlled second oxide layer 9. Since the step sides are smooth with extremely large radius corners, the upper conductor layer does not suffer from poor, thin or absent deposition regions caused by shadowing, etc. or structurally weak regions caused by small radius of curvature cusps or the like.

It will be seen that successive metallized layers can be built up using the process described above; the procedure is not limited to the fabrication of only two layers.

Figure 7:
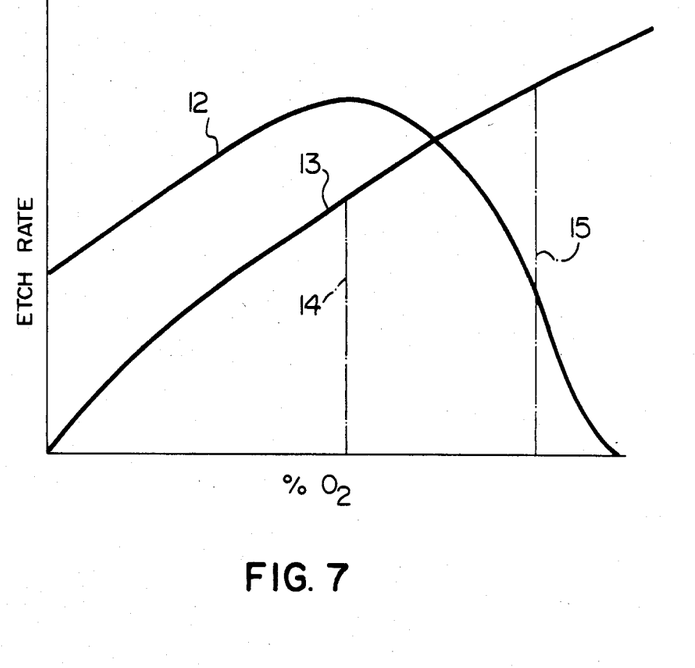
FIG. 7 is a graph of etch rate vs percent oxygen for the photoresist and oxide layers.

Turning now to FIG. 7, a graph of etch rate vs oxygen concentration in the etchant gas $CF_4$ is shown for a vapour-deposited silicon dioxide layer and for a negative type photoresist in a plasma etcher. A silicon dioxide etch rate curve 12 increases as the oxygen concentration increases, eventually decreasing to zero. However the etch rate curve 13 for negative photoresist continuously increases with increase in oxygen concentration, crossing the etch rate curve for silicon dioxide.

A pair of dashed lines 14 and 15 designating constant oxygen levels are shown intersecting the photoresist etch rate curve. We have discovered that etching proceeds non-uniformly at oxygen concentrations below oxygen level 14, and also non-uniformly at higher oxygen concentrations than the oxygen level shown by vertical line 15. We have found that the intersection point between the etch rates of silicon dioxide and the negative photoresist is located between the two oxygen levels designated by vertical lines 14 and 15, and it is approximately this oxygen level which provides both uniform etching and similar etch rates between the oxide layer and photoresist which we prefer. The neighbourhood of this crossover point which has been found to be sufficiently accurate for the operation of the process according to this invention is between about 32–50% oxygen in a gas of $CF_4$.

On the other hand, the oxygen concentration preferred by the authors in the article in the Journal of Electrochemical Society noted above is 8% oxygen. The authors note that a different gas produces a better etch rate ratio, but leaves a very rough surface. It is believed that one of the reasons for obtaining a very rough surface is the use of positive type photoresist, which achieves very rough upper surface during etching, as shown in FIG. 3B. Consequently only a very slow etching rate can be used to obtain a reasonable yield in prior art process, but as noted with reference to FIG. 7 of this specification, we have found the low oxygen concentration to result in non-uniform etching.

The use of negative type photoresist having a smooth upper surface during etching, allows us to greatly accelerate the etch rate to the point at which uniform etching is obtained at the same time as highly comparable etch rates between the photoresist and immediately underlying silicon dioxide layers. Both are important for the present invention to be carried out properly.

The authors of the aforenoted article indicate that the step heights are reduced by about 60%, and the angles made by the phosphorus-doped glass going over the steps to less than 30°, e.g. 5°–30°. In the present process, we have found the step heights, after applying the second silicon dioxide layer, to be approximately maintained, but the step angles are reduced to the point of virtual invisibility using a scanning electron microscope.

This process appears to operate successfully with conductor line widths as narrow as 2–3 microns, and as great as several hundred microns, and its utility appears to be independent of line width, at least within the range noted above.

It was noted earlier that it is preferred that undoped silicon dioxide should be used over the underlying conductor layer, since the phosphorus can form phosphoric acid which can attack aluminum conductors. However in some circumstances it may be desirable to use phosphorus doped silicon dioxide for the following reason. Where an overlying conductor layer is to contact an underlying conductor surface, the second silicon dioxide layer 9, first silicon dioxide layer 3, and the silicon dioxide layer underlying layer 3 may be etched to the surface of the basic doped or conductive semiconductor substrate, or to a doped silicon or other conductive layer overlying it. In this case a via hole which is etched may well have sharp edges at the surface of the semiconductor or the polysilicon layer and/or at the top surface of the hole. In this case a reflow technique may be desirable, by which the edges of the silicon dioxide layer are rounded. If a phosphorus-doped upper silicon dioxide layer is used, the edges of the layer may be softened by reflowing it. Then the lowest metallized layer is deposited over the top surface of the silicon dioxide, over the rounded edges, to the semiconductor surface.

Rather than reflowing the upper silicon dioxide layer, an etch may be desirable, which etches faster at the top edges of the via hole, rounding the edges of the layer. In this case an upper layer of phosphorus-doped silicon dioxide will be desirable, since undoped silicon dioxide is difficult to etch and simultaneously obtain rounded via hole edges.

It should be noted that instead of using silicon dioxide for layer 9, silicon nitride can be used. Indeed, silicon nitride can be used instead of layer 3 if such is the design of the integrated circuit. However, since silicon nitride is of different composition than silicon dioxide, it will etch at a different rate than curve 12 (although following a generally similar form) shown in FIG. 7. The dielectric constant of silicon nitride being greater than that of silicon dioxide, it of course would be preferable to use a thicker layer 9 than of silicon dioxide in order to minimize capacitive coupling between the upper conductor 10 and the lower conductor 2.

A person skilled in the art understanding this invention may now conceive of alternative structures or variations in design using the principles of this invention. All are considered to be within the sphere and scope of the invention as defined in the claims appended hereto.

We claim:
1. A process for planarizing an integrated circuit comprising:
   (a) depositing and defining first metal conductors on the surface of an integrated circuit,
   (b) depositing a first dielectric layer over the surface of the integrated circuit including said conductors, the dielectric layer being comprised of a material selected from the group consisting of silicon dioxide and silicon nitride,
   (c) depositing and polymerizing a layer of negative isoprene resist over the surface of the dielectric layer,
   (d) etching the surface of the isoprene and dielectric layers, with an etchant to which the first metal conductors are substantially immune, to a predetermined thickness over the metal conductors, in an atmosphere containing 32 to 50% oxygen in a CF$_4$ gas in a plasma etcher,
   (e) cleaning the etched surface, and
   (f) depositing a second dielectric layer over the surface selected fron the group consisting of silicon dioxide and silicon nitride,
   whereby a planarized surface having very large radius of curvature steps over the metal conductors is produced.

2. A process as defined in claim 1, including the further step of depositing and defining second metal conductors on the surface of the second dielectric layer.

3. A process as defined in claim 1 in which at least the second dielectric layer is composed of undoped silicon dioxide.

4. A process as defined in claim 1, in which the metal conductors are comprised of an alloy of aluminum and silicon.

5. A process as defined in claim 1, 2 or 3 in which the negative isoprene resist is a cis polyisoprene.

6. A process as defined in claim 1, 2 or 3 in which the negative isoprene resist is a negative type photoresist.

7. A process as defined in claim 1, 2 or 3 in which the first metal conductors are comprised of aluminum.

8. A process as defined in claim 1, 2 or 3 in which the first metal conductors are composed of aluminum or an alloy of aluminum which is compatible with said first dielectric layer.

9. A process as defined in claim 1 wherein the first metal conductors are first aluminum conductors and the first dielectric layer is a first silicon dioxide layer, and in which the surface of the photoresist and first silicon dioxide layer are etched in the etching step until the vicinity of the upper surface of the first aluminum conductors is reached.

10. A process as defined in claim 1 wherein the first metal conductors are first aluminum conductors and the first dielectric layer is a first silicon dioxide layer, and in which the surface of the photoresist and first silicon dioxide layer are etched in the etching step until the upper surface of the first aluminum conductors is exposed.

11. A process as defined in claim 1, wherein the layer of negative isoprene resin has a thickness of at least 0.5 micron.

12. A process for planarizing an integrated circuit comprising:
   (a) depositing and defining first aluminum conductors having a thickness of between approximately 0.7 and 1.3 microns on the passivated surface of an integrated circuit,
   (b) depositing between about 0.8 and 1.4 microns of a first silicon dioxide layer over the surface of the integrated circuit including the conductors,
   (c) depositing by spinning a negative photoresist layer of about 0.9 microns over the surface of the silicon dioxide layer,
   (d) baking the photoresist layer at 160° C. for about 20 minutes, (e) plasma etching the photoresist layer and first silicon dioxide layer in a CF$_4$ atmosphere including about 32% to 50% oxygen in a plasma etcher, to the upper surface of the first conductors, (f) cleaning the etched surface, (g) depositing between about 0.4 and 1.0 micron of a second silicon dioxide layer over the etched surface, whereby a planarized surface devoid of sharply angled steps in the regions around and over the aluminum conductors is produced.

13. A process as defined in claim 12, including depositing the silicon dioxide layers using a CVD or LPCVD process.

14. A process as defined in claim 12 including depositing the silicon dioxide layer using a plasma enhanced deposition process.

15. A process as defined in claim 12, in which the second, or the first and second, silicon dioxide layers are composed of undoped silicon dioxide.

16. A process as defined in claim 12, 13 or 15, including the further step of depositing and defining second aluminum conductors on the second silicon dioxide layer.

17. A process for planarizing an integrated circuit comprising:

(a) depositing and defining first aluminum conductors having a thickness of between approximately 0.7 and 1.3 microns on the passivated surface of an integrated circuit, (b) depositing between about 0.8 and 1.4 microns of a first silicon dioxide layer over the surface of the integrated circuit including the conductors, (c) depositing by spinning a negative photoresist layer of about 0.9 microns over the surface of the silicon dioxide layer, (d) baking the photoresist layer at 160° C. for about 20 minutes, (e) plasma etching the photoresist layer and first silicon dioxide layer in a CF$_4$ atmosphere including about 32% to 50% oxygen in a plasma etcher, to the upper surface of the first conductors, at a pressure of about 0.9 to 1.6 torr, (f) cleaning the etched surface, (g) depositing between about 0.4 and 1.0 micron of a second silicon dioxide layer over the etched surface, whereby a planarized surface devoid of sharply angled steps in the regions around and over the aluminum conductors is produced.

18. A process for planarizing an integrated circuit comprising:

(a) depositing and defining first aluminum conductors having a thickness of between approximately 0.7 and 1.3 microns on the passivated surface of an integrated circuit, (b) depositing between about 0.8 and 1.4 microns of a first silicon dioxide layer over the surface of the integrated circuit including the conductors, (c) depositing by spinning a negative photoresist layer of about 0.9 microns over the surface of the silicon dioxide layer, (d) baking the photoresist layer at 160° C. for about 20 minutes, (e) plasma etching the photoresist layer and first silicon dioxide layer in a CF$_4$ atmosphere including about 32% to 50% oxygen in a plasma etcher, to the upper surface of the first conductors, at a pressure of about 0.9 to 1.6 torr, and a temperature of about 70° C., (f) cleaning the etched surface, (g) depositing between about 0.4 and 1.0 micron of a second silicon dioxide layer over the etched surface, whereby a planarized surface devoid of sharply angled steps in the regions around and over the aluminum conductors is produced.

19. A process for planarizing an integrated circuit comprising:

(a) vapor depositing a first layer of silicon dioxide on the surface of an integrated circuit having metal or metal alloy conductors resistant to etching in an atmosphere of CF$_4$+O$_2$ (32–50%) on said surface, the thickness of said layer being about the same as the thickness of the conductors, (b) depositing and polymerizing a layer of negative type photoresist on the surface of the silicon dioxide layer, the thickness of the deposit being about the same or less than that of the silicon dioxide layer, (c) plasma etching the photoresist and layer of silicon dioxide in an atmosphere of CF$_4$ with about 32% to 50% oxygen, (d) cleaning the etched surface, (e) vapor depositing a second layer of silicon dioxide or silicon nitride of about the same thickness as the conductors over the etched surface, whereby a planarized surface devoid of sharp angled corners is produced.

20. A process as defined in claim 19, in which the second or the first and second silicon dioxide layers are undoped.

21. A process as defined in claim 19 or 20 including the further step of depositing and defining a metal or metal alloy conductor on the surface of said second layer.

22. A process as defined in claim 19 or 20 in which the etch time proceeds to the point of exposure of the conductors.

23. A process as defined in claim 19 or 20 in which the etch time proceeds to the point of exposure of the conductors, and including the further step following the deposition of the second layer of silicon dioxide of depositing and defining a metal or metal alloy conductor on the surface of said second layer.

24. A process for planarizing an integrated circuit comprising:

(a) vapor depositing a first layer of silicon dioxide on the surface of an integrated circuit having metal or metal alloy conductors resistant to etching in an atmosphere of CF$_4$+O$_2$ (32–50%) on said surface, the thickness of said layer being about the same as the thickness of the conductors, (b) depositing and polymerizing a layer of negative type photoresist on the surface of the silicon dioxide layer, the thickness of the deposit being about the same or less than that of the silicon dioxide layer, (c) plasma etching the photoresist and layer of silicon dioxide in an atmosphere of CF$_4$ with about 32% to 50% oxygen, at a pressure of about 0.9 to 1.6 torr, (d) cleaning the etched surface, (e) vapor depositing a second layer of silicon dioxide or silicon nitride of about the same thickness as the conductors over the etched planarized surface, whereby a surface devoid of sharp angled corners is produced.

25. A process for planarizing an integrated circuit comprising:
   (a) vapor depositing a first layer of silicon dioxide on the surface of an integrated circuit having metal or metal alloy conductors resistant to etching in an atmosphere of $CF_4+O_2$ (32–50%) on said surface, the thickness of said layer being about the same as the thickness of the conductors,
   (b) depositing and polymerizing a layer of negative type photoresist on the surface of the silicon dioxide layer, the thickness of the deposit being about the same or less than that of the silicon dioxide layer,
   (c) plasma etching the photoresist and layer of silicon dioxide in an atmosphere of $CF_4$ with about 32% to 50% oxygen, at a pressure of about 0.9 to 1.6 torr, and a temperature of about 70° C.,
   (d) cleaning the etched surface,
   (e) vapor depositing a second layer of silicon dioxide or silicon nitride of about the same thickness as the conductors over the etched surface,
   whereby a planarized surface devoid of sharp angled corners is produced.

26. A process for planarizing an integrated circuit comprising:
   (a) depositing and defining first aluminum conductors on the surface of an integrated circuit,
   (b) depositing a first silicon dioxide layer over the surface of the integrated circuit including the conductors,
   (c) depositing and polymerizing a layer of negative photoresist carrier comprised of cis polyisoprene over the surface of the first silicon dioxide layer,
   (d) plasma etching the surface of the photoresist and first silicon dioxide layer to a predetermined thickness over the metal conductors in an atmosphere containing about 32 to 50 percent oxygen in a $CF_4$ gas in a plasma etcher,
   (e) cleaning the etched surface, removing any remaining photoresist,
   (f) depositing a second layer of silicon dioxide of predetermined thickness over the cleaned surface,
   whereby a planarized surface having very large radius of curvature steps over the metal conductors is produced, and
   (g) depositing and defining second aluminum conductors on the surface of the second layer of silicon dioxide.

27. A process for planarizing an integrated circuit comprising:
   (a) depositing and defining first aluminum conductors on the surface of an integrated circuit,
   (b) depositing a first silicon dioxide layer over the surface of the integrated circuit including the conductors,
   (c) depositing and polymerizing a layer of negative photoresist carrier comprised of cis polyisoprene over the surface of the first silicon dioxide layer,
   (d) plasma etching the surface of the photoresist and first silicon dioxide layer in an atmosphere containing about 32 to 50% oxygen in a $CF_4$ gas in a plasma etcher until the vicinity of the upper surface of the first aluminum conductors is reached,
   (e) cleaning the etched surface, removing any remaining photoresist,
   (f) depositing a second layer of silicon dioxide of predetermined thickness over the cleaned surface,
   whereby a planarized surface having very large radius of curvature steps over the metal conductors is produced, and
   (g) depositing and defining second aluminum conductors on the surface of the second layer of silicon dioxide.

28. A process for planarizing an integrated circuit comprising:
   (a) depositing and defining first aluminum conductors on the surface of an integrated circuit,
   (b) depositing a first silicon dioxide layer over the surface of the integrated circuit including the conductors,
   (c) depositing and polymerizing a layer of negative photoresist carrier comprised of cis polyisoprene over the surface of the first silicon dioxide layer,
   (d) plasma etching the surface of the photoresist and first silicon dioxide layer in an atmosphere containing about 32 to 50% oxygen in a $CF_4$ gas in a plasma etcher until the upper surface of the first aluminum conductor is exposed,
   (e) cleaning the etched surface, removing any remaining photoresist,
   (f) depositing a second layer of silicon dioxide of predetermined thickness over the cleaned surface,
   whereby a planarized surface having very large radius of curvature steps over the metal conductors is produced, and
   (g) depositing and defining second aluminum conductors on the surface of the second layer of silicon dioxide.

29. A process as defined in claim 26, 27 or 28, wherein the layer of negative photoresist carrier has a thickness of at least 0.5 microns.

30. A process for planarizing an integrated circuit comprising:
   (a) depositing and defining first aluminum conductors on the surface of an integrated circuit,
   (b) depositing a first silicon dioxide layer over the surface of the integrated circuit including the conductors,
   (c) depositing and polymerizing a layer of negative photoresist carrier comprised of cis polyisoprene over the surface of the first silicon dioxide layer,
   (d) plasma etching the surface of the photoresist and first silicon dioxide layer in an atmosphere containing about 32 to 50% oxygen in a $CF_4$ gas in a plasma etcher, at a pressure of about 0.9 to 1.6 torr,
   (e) cleaning the etched surface, removing any remaining photoresist,
   (f) depositing a second layer of silicon dioxide of predetermined thickness over the cleaned surface,
   whereby a planarized surface having very large radius of curvature steps over the metal conductors is produced, and
   (g) depositing and defining second aluminum conductors on the surface of the second layer of silicon dioxide.

31. A process for planarizing an integrated circuit comprising:
   (a) depositing and defining first aluminum conductors on the surface of an integrated circuit,
   (b) depositing a first silicon dioxide layer over the surface of the integrated circuit including the conductors, (c) depositing and polymerizing a layer of negative photoresist carrier comprised of cis polyisoprene over the surface of the first silicon dioxide layer, (d) plasma etching the surface of the photoresist and first silicon dioxide layer in an atmosphere containing about 32 to 50% oxygen in a $CF_4$ gas in a plasma etcher, at a pressure of about 0.9 to 1.6 torr, and at a temperature of about 70° C., (e) cleaning the etched surface, removing any remaining photoresist, (f) depositing a second layer of silicon dioxide of predetermined thickness over the cleaned surface, whereby a planarized surface having very large radius of curvature steps over the metal conductors is produced, and (g) depositing and defining second aluminum conductors on the surface of the second layer of silicon dioxide.

32. A process as defined in claim 30 or 31, in which the surface of the photoresist and first silicon dioxide layer are etched in the etching step until the vicinity of the upper surface of the first aluminum conductors is reached.

33. A process as defined in claim 30 or 31, in which the surface of the photoresist and first silicon dioxide layer are etched in the etching step until the upper surface of the first aluminum conductor is exposed.

34. A process as defined in claim 30 or 31, wherein the layer of negative photoresist carrier has a thickness of at least 0.5 micron.

* * * * *